United States Patent
Kim et al.

(10) Patent No.: US 8,017,991 B2
(45) Date of Patent: *Sep. 13, 2011

(54) NON-VOLATILE MEMORY DEVICE AND METHODS OF OPERATING AND FABRICATING THE SAME

(75) Inventors: Won-joo Kim, Yongin-si (KR); Suk-pil Kim, Yongin-si (KR); Yoon-dong Park, Yongin-si (KR); June-mo Koo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1167 days.

This patent is subject to a terminal disclaimer.

(21) Appl. No.: 11/724,290

(22) Filed: Mar. 15, 2007

(65) Prior Publication Data
US 2008/0023749 A1 Jan. 31, 2008

(30) Foreign Application Priority Data
Jul. 28, 2006 (KR) .................... 10-2006-0071573

(51) Int. Cl.
*H01L 29/788* (2006.01)
(52) U.S. Cl. ........ 257/318; 257/314; 257/315; 257/316; 257/317; 257/319; 257/320; 257/E21.68; 438/257; 438/258; 438/259; 438/260; 438/261; 438/262; 438/263; 438/264; 438/265; 438/266; 438/267
(58) Field of Classification Search .................. 257/324, 257/328, 314–320, E21.68; 438/257–267
See application file for complete search history.

(56) References Cited

U.S. PATENT DOCUMENTS

| 5,179,427 | A   | 1/1993  | Nakayama et al. |
|-----------|-----|---------|-----------------|
| 6,475,872 | B1  | 11/2002 | Jung            |
| 6,627,943 | B2  | 9/2003  | Shin et al.     |
| 6,936,887 | B2  | 8/2005  | Harari et al.   |
| 7,196,370 | B2  | 3/2007  | Kai et al.      |
| 7,491,998 | B2  | 2/2009  | Chang et al.    |
| 7,550,393 | B2* | 6/2009  | Jeong ........................... 438/733 |
| 7,579,247 | B2  | 8/2009  | Harari et al.   |

(Continued)

FOREIGN PATENT DOCUMENTS
JP 1994-208796 7/1994

OTHER PUBLICATIONS

Chinese Office Action dated Jun. 6, 2008 issued in corresponding Chinese Application No. 2005101068619 and English translation thereof.

(Continued)

*Primary Examiner* — Samuel A Gebremariam
(74) *Attorney, Agent, or Firm* — Harness, Dickey & Pierce, P.L.C.

(57) ABSTRACT

Example embodiments provide a non-volatile memory device with increased integration and methods of operating and fabricating the same. A non-volatile memory device may include a plurality of first storage node films and a plurality of first control gate electrodes on a semiconductor substrate. A plurality of second storage node films and a plurality of second control gate electrodes may be recessed into the semiconductor substrate between two adjacent first control gate electrodes and below the bottom of the plurality of first control gate electrodes. A plurality of bit line regions may be on the semiconductor substrate and each may extend across the plurality of first control gate electrodes and the plurality of second control gate electrodes.

26 Claims, 6 Drawing Sheets

U.S. PATENT DOCUMENTS

| | | | |
|---|---|---|---|
| 7,679,960 B2 * | 3/2010 | Hyun et al. | 365/185.18 |
| 7,750,393 B2 | 7/2010 | Kim et al. | |
| 2004/0080991 A1 | 4/2004 | Sawasaki | |
| 2005/0253185 A1 | 11/2005 | Smith | |
| 2006/0197111 A1 | 9/2006 | Matsuzawa | |
| 2006/0278913 A1 | 12/2006 | Mihnea et al. | |
| 2008/0023749 A1 | 1/2008 | Kim et al. | |
| 2008/0025096 A1 * | 1/2008 | Kim et al. | 365/185.14 |
| 2008/0175061 A1 * | 7/2008 | Kim et al. | 365/185.18 |
| 2008/0191264 A1 * | 8/2008 | Kim et al. | 257/319 |

OTHER PUBLICATIONS

European Search Report dated Apr. 4, 2008 issued in corresponding European Application No. 07122917.3.

Office Action dated Dec. 22, 2010 issued in related U.S. Appl. No. 11/704,205.

\* cited by examiner

NON-VOLATILE MEMORY DEVICE AND METHODS OF OPERATING AND FABRICATING THE SAME

PRIORITY STATEMENT

This application claims the benefit of Korean Patent Application No. 10-2006-0071573, filed on 28 Jul. 2006, in the Korean Intellectual Property Office, the disclosure of which is incorporated herein in its entirety by reference.

BACKGROUND

1. Field

Example embodiments relate to a non-volatile memory device, and, for example, to a non-volatile memory device having a recess-type control gate electrode and methods of operating and fabricating the same.

2. Description of the Conventional Art

As semiconductor products' dimensions decrease and operation speeds increase, operation speed and integration of non-volatile memory devices used in these products has also increased. Accordingly, non-volatile memory devices having three-dimensional structures have replaced conventional art non-volatile memory devices having planar structures. Non-volatile memory devices having three-dimensional structures include, for example, recess-type control gate electrodes extended into semiconductor substrates.

Non-volatile memory devices having three-dimensional structures have channel areas larger than conventional art non-volatile memory devices with planar structures and, thus, have an increased operation current, which may result in increased speed of non-volatile memory devices.

However, non-volatile memory devices having three-dimensional structures may be limited as to how much their integration may increase, because they may still have large impurity doped areas such as source regions and drain regions. For example, non-volatile memory devices having NAND structures that are advantageous for integration may require larger, alternating source regions and drain regions, such that they may be limited as to how much their integration can increase.

FIG. 1 is a circuit diagram of a conventional art non-volatile memory device. In FIG. 1, word lines WLs and bit lines BLs may cross each other. Sources and drains (not shown) of memory transistors $T_m$ may be connected to bit lines BLs. Control gates of memory transistors $T_m$ may be connected to word lines WLs. Conventional art non-volatile memory devices having the above structure may be referred to as a nitride programmable read-only memory (NROM) device. Word lines WLs of an NROM device may have a larger impurity doped area, which may prevent or reduce integration of NROM devices.

SUMMARY

Example embodiments may provide a non-volatile memory device that may increase its integration.

Example embodiments may provide a method of operating a non-volatile memory device with increased integration.

Example embodiments may provide a method of fabricating non-volatile memory device with increased integration.

Example embodiments may be directed to a non-volatile memory device that may include a plurality of first control gate electrodes that may be placed on a semiconductor substrate, a plurality of second control gate electrodes that may be placed between two adjacent first control gate electrodes and recessed into the semiconductor substrate below the bottom of the plurality of first control gate electrodes, a plurality of first storage node films that may be placed between the semiconductor substrate and the plurality of first control gate electrodes, a plurality of second storage node films that may be placed between the semiconductor substrate and the plurality of second control gate electrodes, and a plurality of bit line regions in the semiconductor substrate that may each extend across the plurality of first control gate electrodes and the plurality of second control gate electrodes.

In example embodiments, bit line regions may be impurity doped regions in the semiconductor substrate.

In example embodiments, non-volatile memory device may further include a plurality of first channel regions that may be formed in an area bounded by the surface of the semiconductor substrate below the plurality of first gate electrodes, and a plurality of second channel regions that may be formed in the area bounded by the surface of the semiconductor substrate, the plurality of second control gate electrodes, and two adjacent bit line regions.

In example embodiments, a plurality of first channel regions and plurality of second channel regions may be spaced apart from each other.

Example embodiments may provide a method of operating the non-volatile memory device that may include supplying a program voltage to at least one of the control gate electrodes and supplying an operation voltage between two adjacent bit line regions.

Example embodiments may provide a method of fabricating a non-volatile memory device that may include forming a plurality of trenches in a semiconductor substrate, forming a plurality of bit line regions in the semiconductor substrate to successively extend across the plurality of trenches, forming a plurality of first storage node films on the surface of the semiconductor substrate between the plurality of trenches, forming a plurality of second storage node films on the semiconductor substrate inside the plurality of trenches, forming a plurality of first control gate electrodes on the plurality of first storage node films, and forming a plurality of second control gate electrodes on the recessed plurality of second storage node films to sit below the bottom of the plurality of first control gate electrodes.

BRIEF DESCRIPTION OF THE DRAWINGS

Advantages and features, including those described above, of example embodiments will become more apparent by describing example embodiments with reference to the attached drawings in which.

DETAILED DESCRIPTION OF EXAMPLE EMBODIMENTS

Figure 1:
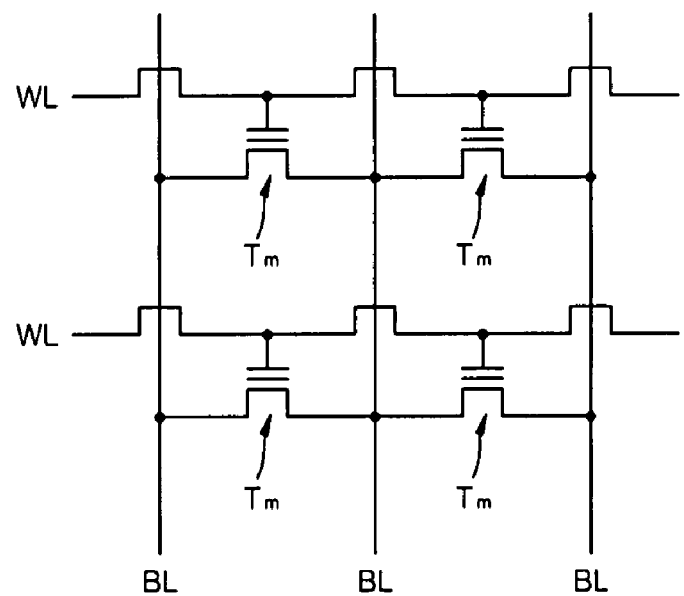
FIG. 1 is a circuit diagram of a conventional art non-volatile memory device.

Various example embodiments will now be described more fully with reference to the accompanying drawings in which some example embodiments are shown. In the drawings, the thicknesses of layers and regions are exaggerated for clarity.

Detailed illustrative embodiments are disclosed herein. However, specific structural and functional details disclosed herein are merely representative for purposes of describing example embodiments. This invention may, however, may be embodied in many alternate forms and should not be construed as limited to only example embodiments set forth herein.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 2:
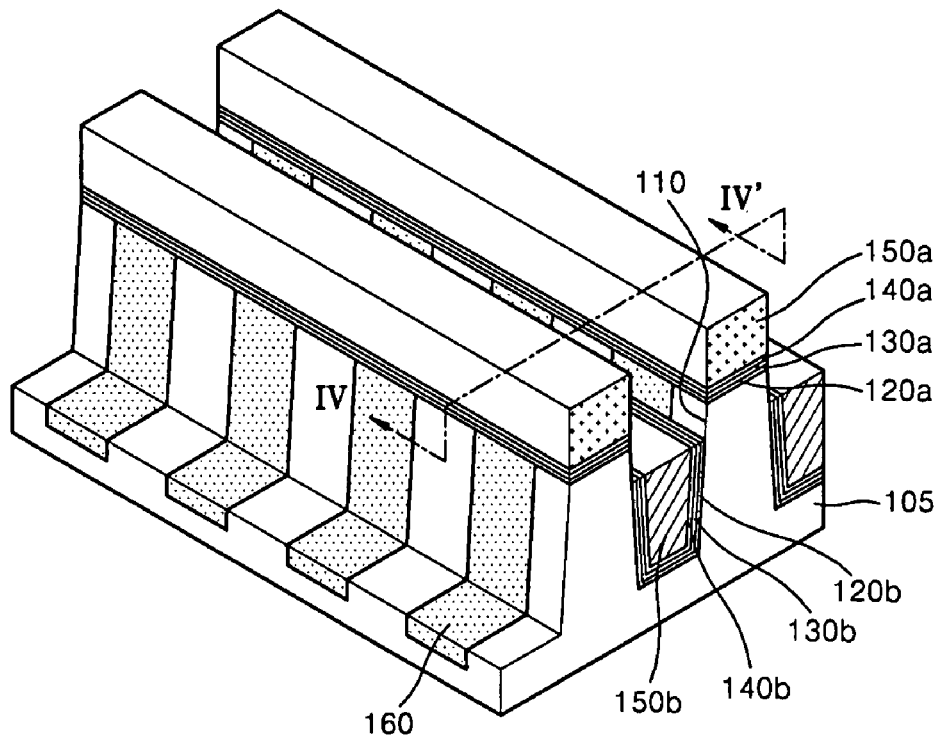
FIG. 2 is a perspective view illustrating a non-volatile memory device according to an example embodiment.
Figure 3:
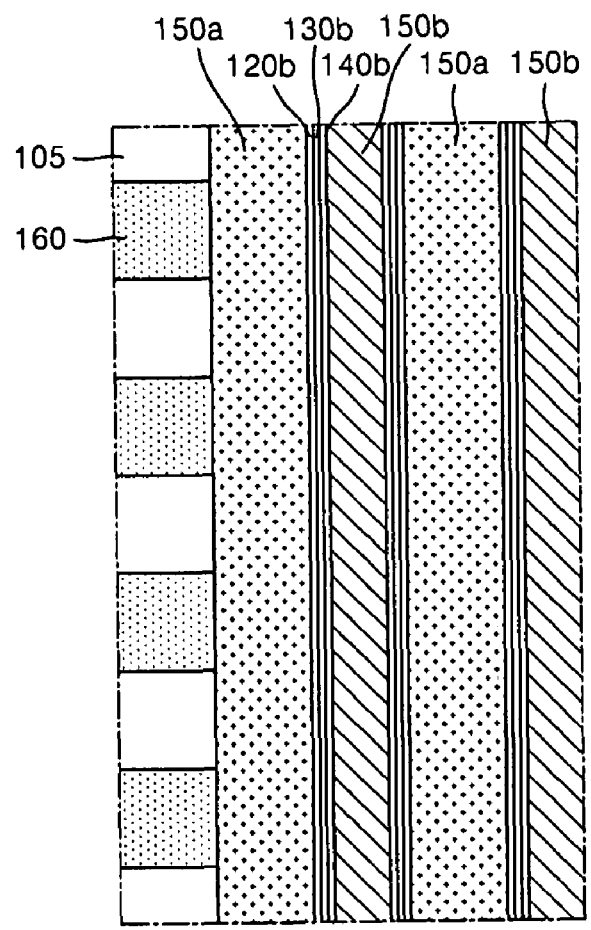
FIG. 3 is an example plan view illustrating the nonvolatile memory device illustrated in FIG. 2.
Figure 4:
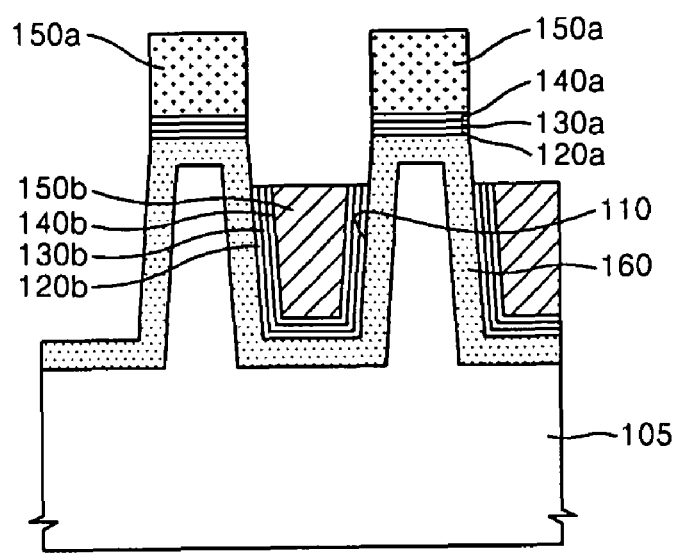
FIG. 4 is an example cross-sectional view taken along the line IV-IV' of the nonvolatile memory device illustrated in FIG. 2.

FIG. 2 is a perspective view illustrating a non-volatile memory device according to an example embodiment. FIG. 3 is an example plan view illustrating the nonvolatile memory device illustrated in FIG. 2. FIG. 4 is an example cross-sectional view taken along the line IV-IV' of the nonvolatile memory device illustrated in FIG. 2.

Non-volatile memory devices according to example embodiments will now be described with reference to FIGS. 2 through 4. The non-volatile memory device may include a plurality of first control gate electrodes 150a and a plurality of second control gate electrodes 150b. A plurality of first storage node films 130a may be between the plurality of first control gate electrodes 150a and a semiconductor substrate 105. A plurality of second storage node films 130b may be between the plurality of second control gate electrodes 150b and the semiconductor substrate 105. Bit line regions 160 may extend across the first and second gate electrodes 150a and 150b in the semiconductor substrate 105.

The first control gate electrodes 150a and the second control gate electrodes 150b may be arranged in the substrate at different depths (and/or thicknesses) so that the top and/or bottom surfaces of any two adjacent electrodes may be at differing depths. For example, second control gate electrodes 150b may be between two adjacent first control gate electrodes 150a but also at a different depth (and/or thicknesses), so that the two electrodes may not touch. There may be any number of first and second control gate electrodes. For example, FIG. 2 may illustrate a cell region of the non-volatile memory device in which additional second control gate electrodes 150b may be formed in the trench on either or both sides of trench 110.

The first control gate electrodes 150a may be formed on the semiconductor substrate 105. The second control gate electrodes 150b may be recessed into the semiconductor substrate 105 so that the first control gate electrodes 150a and the second control gate electrodes 150b may be arranged at different levels from each other. For example, adjacent control gates may be at such different depths (and/or thicknesses) that, while the electrodes may be adjacent in a top view, they may not touch in a side view.

The first control gate electrodes 150a and the second control gate electrodes 150b may be used as word lines and may be controlled so that the first and second storage node films 130a and 130b may program and erase data. Regions 160 formed in the semiconductor substrate 105 may be used as bit lines.

A device isolation film (not shown) may not be in the cell region between the first and second control gate electrodes 150a and 150b and/or between the bit line regions 160. The device isolation film (not shown) may be formed in a peripheral region outside the cell region. A pair of first and second control gate electrodes 150a and 150b and a pair of adjacent bit line regions 160 may form a unit cell.

The semiconductor substrate 105 may include a bulk semiconductor wafer, for example, a silicon wafer, a germanium wafer, a silicon-germanium wafer, or the like. The semiconductor substrate 105 may further include a semiconductor epitaxial layer on the bulk semiconductor wafer. The first and second storage node films 130a and 130b may include a silicon nitride layer, a dot of metal or silicon, a nano-crystal of metal or silicon, or other suitable material to store charge. The first and second control gate electrodes 150a and 150b may include a polysilicon layer, a metal layer, a metal silicide layer, or other suitable material.

In FIG. 4, the bit line regions 160 may each extend across the first and second control gate electrodes 150a and 150b. The bit line regions 160 may be impurity doped regions formed in the semiconductor substrate 105. The bit line regions 160 may be doped with conductive type impurities of a type different from that of the semiconductor substrate 105. For example, if the semiconductor substrate 105 is doped with p-type impurities, the bit line regions 160 may be doped with n-type impurities. The bit line regions 160 may be formed in the surface of the semiconductor substrate 105 to a predetermined or desired depth.

A plurality of first tunneling insulating films 120a may optionally be placed between the first storage node films 130a and the semiconductor substrate 105. A plurality of first blocking insulating films 140a may optionally be placed between the first storage node films 130a and the first control gate electrodes 150a. A plurality of second tunneling insulating films 120b may optionally be placed between the second storage node films 130b and the semiconductor substrate 105. A plurality of second blocking insulating films 140b may optionally be placed between the second storage node films 130b and the second control gate electrodes 150b.

The first and second tunneling insulating films 120a and 120b may include insulating films, for example, oxide films, nitride films, high k dielectric films, or any other suitable materials that allow the tunneling of charge. The first and second blocking insulating films 140a and 140b may include similarly appropriate insulators, for example, oxide films, nitride films, high k dielectric films, or the like.

The second control gate electrodes 150b may be below the bottom of the first control gate electrodes 150a so that the first and second control gate electrodes may not be electrically connected to each other. A plurality of first channel regions (not shown) may be formed in the area bounded by the surface of the semiconductor substrate 105 below the first control gate electrodes 150a and the bit line regions 160. A plurality of second channel regions (not shown) may be formed in the area bounded by the surface of the semiconductor substrate 105 below the second control gate electrodes 150b and between the bit line regions 160. The first and second control gate electrodes 150a and 150b may be spaced apart from each other perpendicular to the semiconductor substrate 105 so that the first and second channel areas may be spaced apart from each other.

If a voltage is supplied to the first and second control gate electrodes 150a and 150b, the first and second channel areas may be operated as channels that may allow the current to flow between the bit line regions 160, thus potentially making the bit lines regions 160 act as source or drain areas.

The first and second control gate electrodes 150a and 150b, which may be operated as word lines, may be spaced apart from each other perpendicular to the semiconductor substrate 105 and close to each other in a planar view so that the planar area of the unit cell of the non-volatile memory device may consume about half the area of a unit cell of a conventional art non-volatile memory device. Example embodiments may have integration about two times higher than the conventional art non-volatile memory device.

Figure 5:
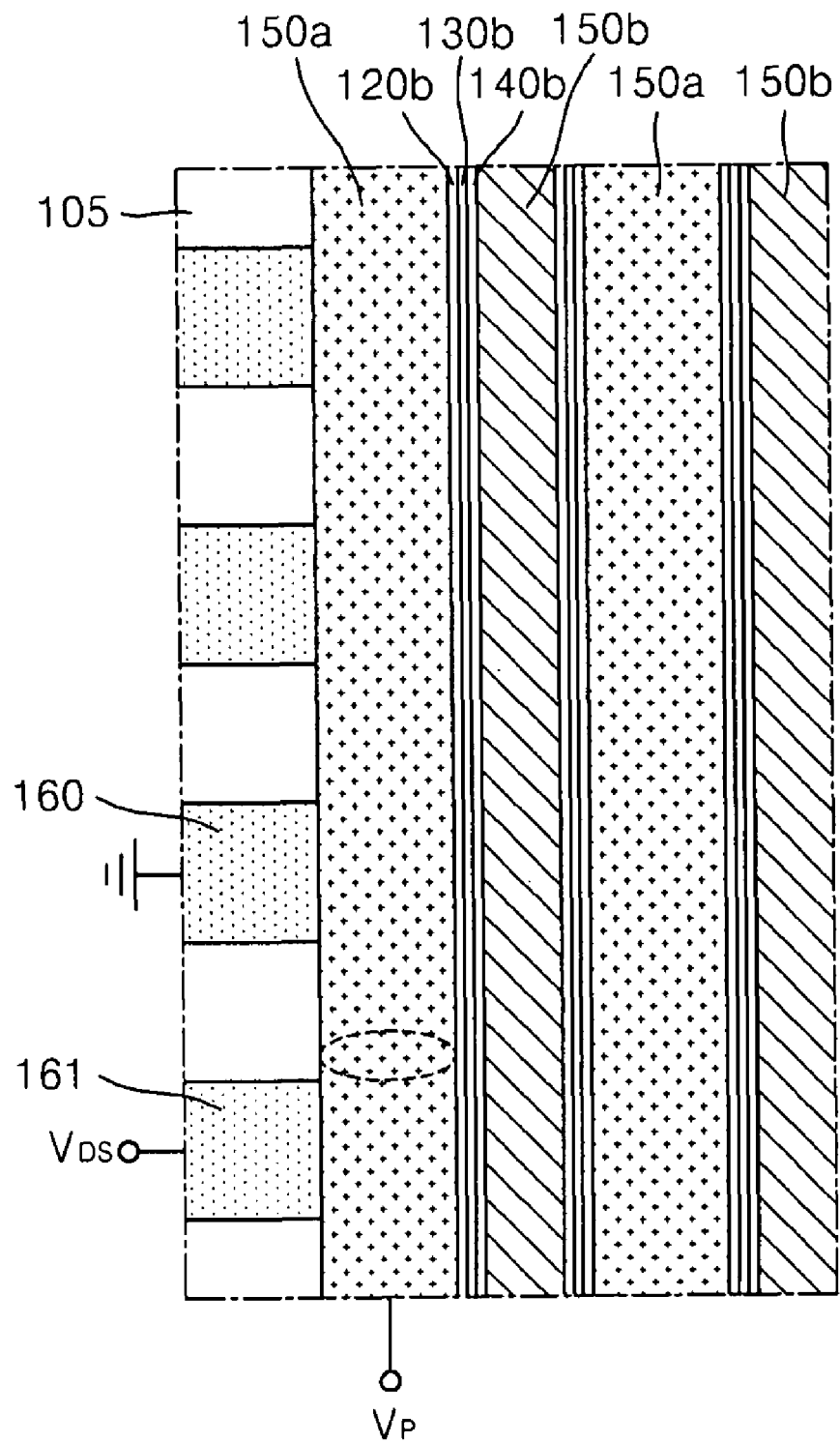
FIGS. 5 and 6 are plan views illustrating a method of operating a non-volatile memory device according to an example embodiment.
Figure 6:
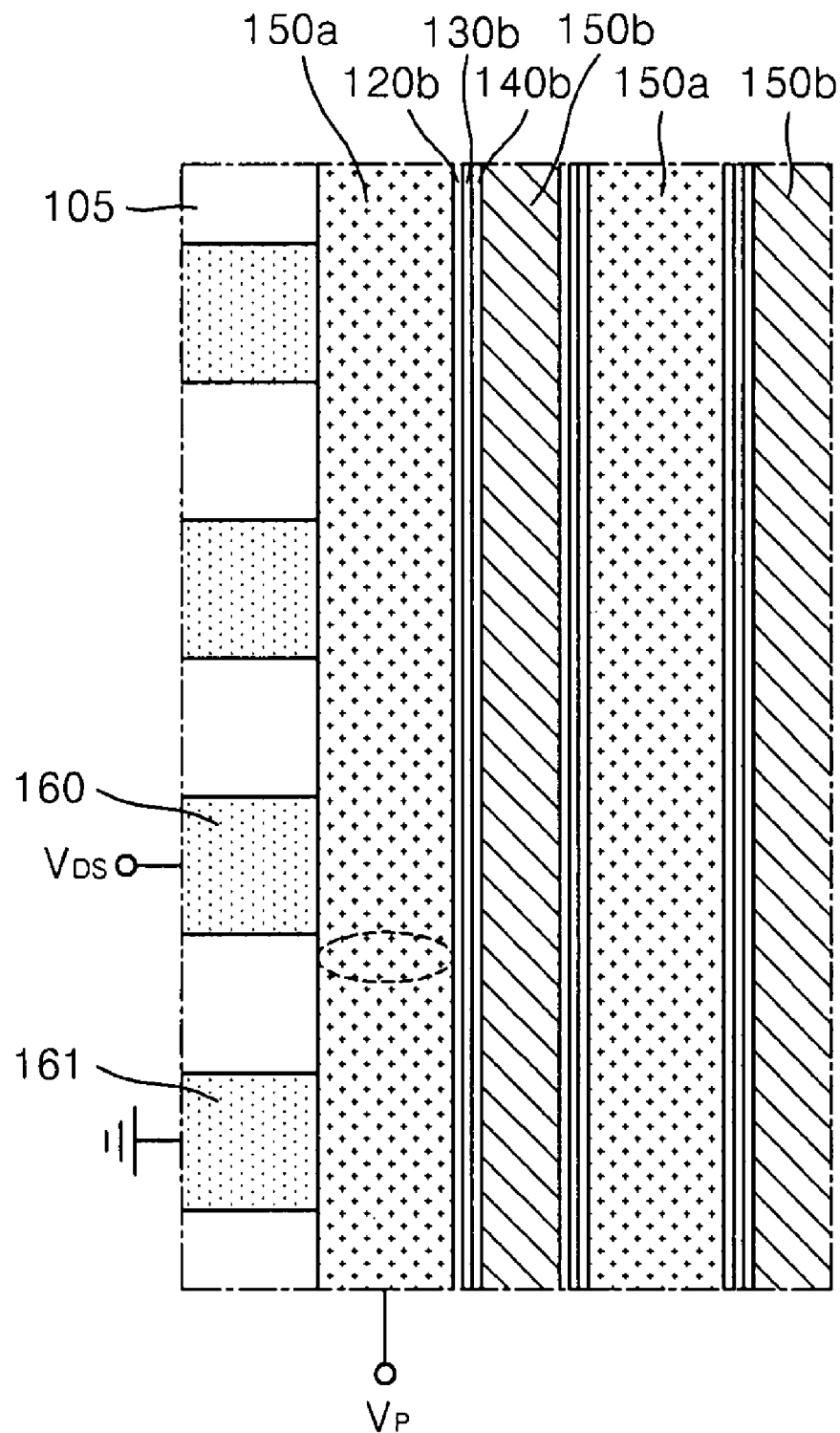

FIGS. 5 and 6 are views illustrating a method of operating a non-volatile memory device according to an example embodiment. In FIG. 5, a program voltage $V_p$ may be supplied to one of the first control gate electrodes 150a. An operation voltage $V_{DS}$ may be supplied between two adjacent bit line regions 160 and 161. The two bit line regions 160 and 161 and the first control gate electrodes 150a may form a unit cell.

The operation voltage $V_{DS}$ may be supplied to the lower bit line region 161 in the unit cell, and the upper bit line region 160 in the unit cell may be grounded, which may induce the flow of current between the two bit line regions 160 and 161 in the unit cell. Electrons may be accelerated from the upper bit line region 160 to the lower bit line region 161 in the unit cell so as to be injected into an oblique section of the lower portion of the first storage node films 130a in the unit cell. This electron injection is sometimes referred to as a channel hot electron injection (CHEI).

In FIG. 6, a program operation may be performed in the opposite direction to the operation voltage $V_{DS}$ of the program operation illustrated in FIG. 5. For example, the ground voltage may be supplied to the lower bit line region 161 in the unit cell, and the operation voltage $V_{DS}$ may be supplied to the upper region 160 in the unit cell, which may induce the flow of the current between the two bit line regions 161 and 160 in the unit cell. Electrons may be accelerated from the upper bit line region 160 in the unit cell to the lower bit lines areas 161 in the unit cell to be injected into an oblique section of the upper portion of the first storage node films 130a in the unit cell.

If the operation method illustrated in FIG. 5 or 6 is independently performed, the first storage node films 130a of the unit cell may program one bit data. If the operation methods illustrated in FIG. 5 and 6 are simultaneously performed, the first storage node films 130a of the unit cell may be separated into an upper portion and a lower portion and may program two-bit data. Two or more bit data may be programmed in the unit cell using a multi level cell (MLC) operation method.

In FIGS. 5 and 6, the program operation described above may be applied to other unit cells in the same manner. The program operation may be simultaneously performed on a plurality of unit cells. For example, the operation voltage $V_{DS}$ may be supplied to a pair or plurality of pairs of bit line regions in FIGS. 5 and 6. The program voltage $V_p$ may be supplied to one or a plurality of first control gate electrodes 150a in FIGS. 5 and 6.

Figure 7:
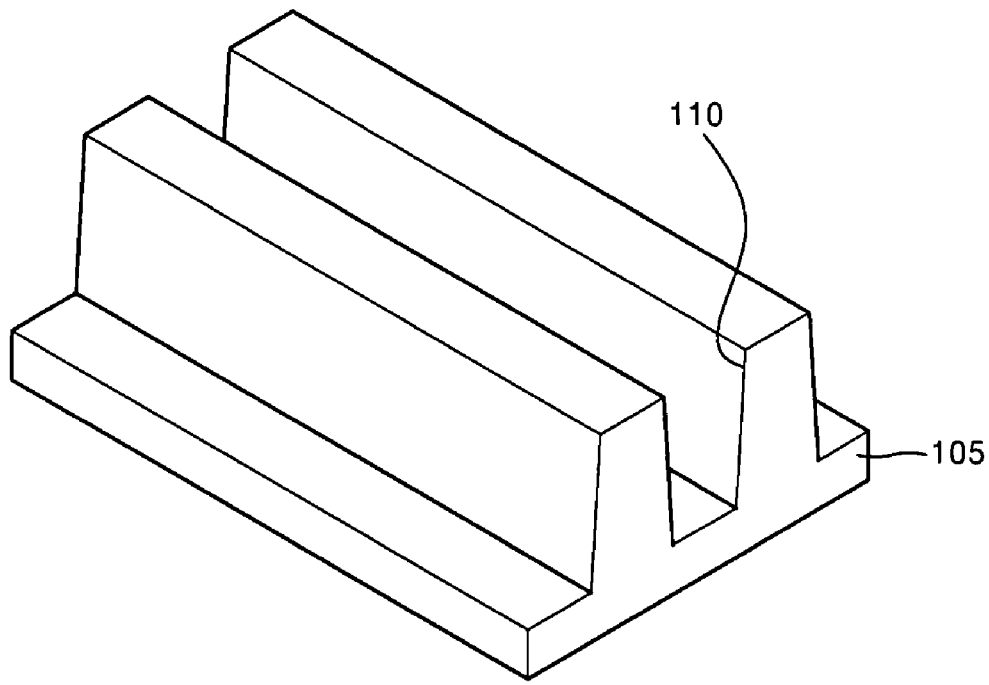
FIGS. 7 through 9 are perspective views illustrating a method of fabricating a non-volatile memory device according to an example embodiment.
Figure 8:
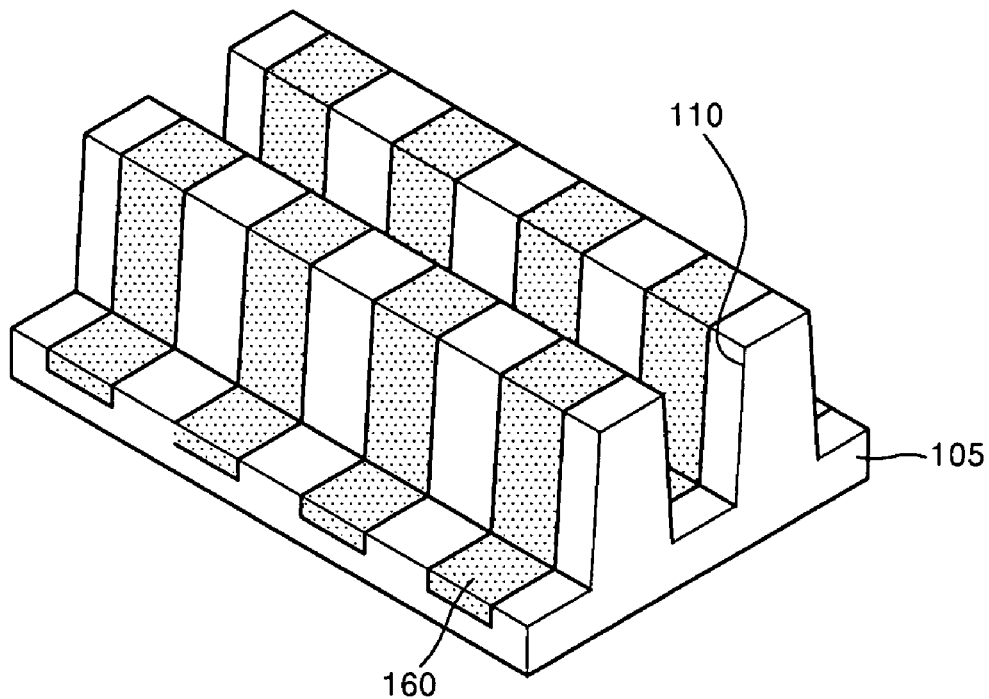
Figure 9:
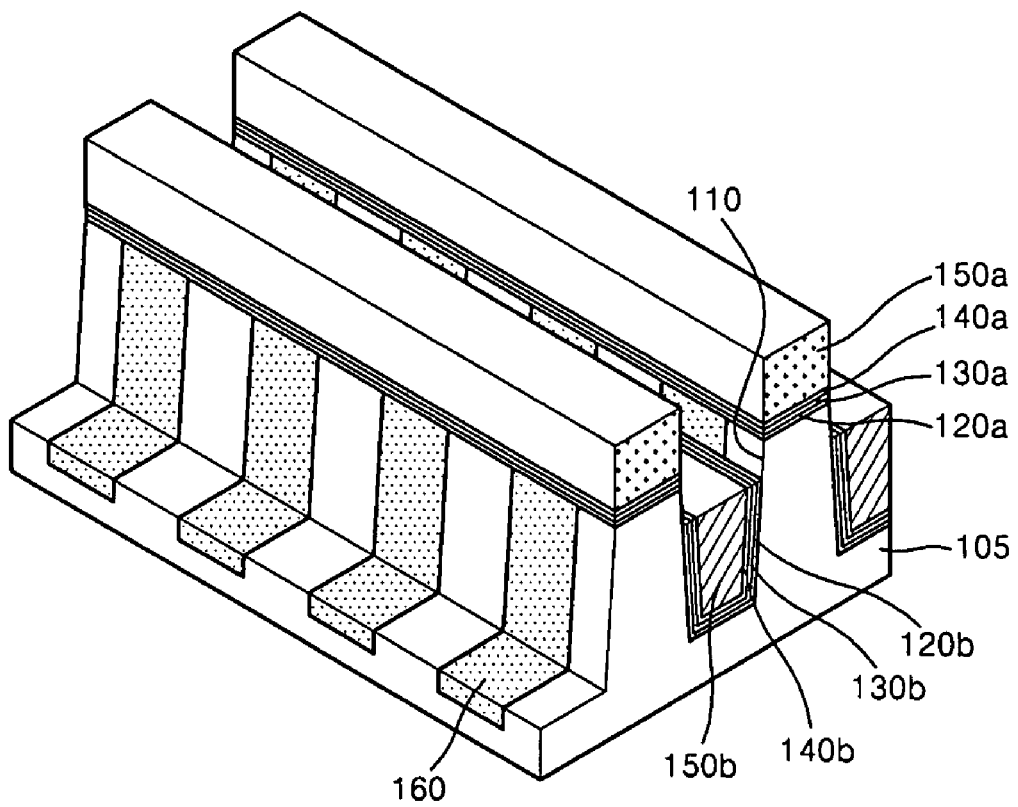

FIGS. 7 through 9 are perspective views illustrating a method of fabricating a non-volatile memory device according to an example embodiment. In FIG. 7, a plurality of trenches 110 may be formed in the semiconductor substrate 105. The trenches 110 may have a predetermined or desired depth from the surface of the semiconductor surface 105. The trenches 110 may be spaced apart from each other and/or extend parallel to each other.

The trenches 110 may be formed by, for example, a mask pattern (not shown) using photolithography technology using as an etching protective film and etching the semiconductor substrate 105 to a predetermined or desired depth. The trenches 110 may be shallower on the inside of the semiconductor substrate 105. Example embodiments may include any number of suitable arrangements and methods of fabricating these structures.

In FIG. 8, a plurality of bit line regions 160 may be formed to extend across trenches 110. As an example, the bit line regions 160 may be formed by doping a semiconductor substrate on the semiconductor substrate 105 with conductive type impurities. If the semiconductor substrate 105 is doped with p-type impurities, the bit line regions 160 may be doped with n-type impurities. The bit line regions 160 may have the same waveform as the semiconductor substrate 105. The bit line regions 160 may be formed along the surface of the semiconductor 105 in which the trenches 110 are formed, and/or they may extend across the trenches 110.

The bit line regions 160 may be doped with impurities using an ion injection method or a plasma doping method, and the depth of the bit line regions 160 may be adjusted according to the requirements of the ion implantation or the plasma doping.

In FIG. 9, a plurality of first and second storage node films 130a and 130b may be formed. A plurality of first and second control gate electrodes 150a and 150b may be formed on top of these storage node films. The first storage node films 130a and the first control gate electrodes 150a may be formed on the semiconductor substrate 105 between the trenches 110. The second storage node films 130b and the second control gate electrodes 150b may be formed on the semiconductor substrate 105 in the trenches 110 so as to be recessed into the semiconductor substrate 105. The second storage node films 130b and the second control gate electrodes 150b may be formed so as to partially fill the trenches 110.

A plurality of first tunneling insulation films 120a may be formed on the semiconductor substrate 105 between the trenches 110. A plurality of second tunneling insulation films 120b may be formed on the semiconductor substrate 105 in the trenches 110. A plurality of first storage node films 130a may be formed on the first tunneling insulation film 120a. A plurality of second storage node films 130b may be formed on the second tunneling insulation films 120b. A plurality of first blocking insulation film 140a may be formed on the first storage node film 130a. A plurality of second blocking insulation films 140b may be formed on the second storage node films 130b. The first control gate electrodes 150a may be formed on the first blocking insulation films 140a. The second control gate electrodes 150b may be formed on the second blocking insulation films 140b.

The first tunneling insulation films 120a, the first storage node films 130a, the first blocking insulation films 140a, and the first control gate electrodes 150a may be formed as a layer and separated simultaneously or sequentially from each other using a photolithography and etching or similar process. Similarly, the second tunneling insulation films 120b, the second storage node films 130b, the second blocking insulation films 140b, and the second control gate electrodes 150b may also be formed as a layer and separated simultaneously or sequentially from each other during the photolithography and etching or similar process.

The first and second tunneling insulation films 120a and 120b may be formed using a thermal oxidation method, a chemical vapor deposition (CVD) method, or another suitable method and may include an oxide film, nitride film, high k dielectric film, or similar material. The first and second storage node films 130a and 130b may include a silicon nitride layer, dot of metal or silicon, a nano-crystal of metal or silicon, or similarly-suitable material using the CVD method or the like. The first and second blocking insulation layers 140a and 140b may include an oxide film, nitride film, high k dielectric film, or similarly suitable material using the CVD method or the like. The first and second control gate electrodes 150a and 150b may by formed using a physical vapor deposition (PVD) method, the CVD method, or the like and may include a polysilicon layer, metal layer, a metal-silicide layer, or a similarly-suitable material.

In another example embodiment, the first and second tunnel insulation films 120a and 120b and the first and second blocking insulation films 140a and 140b may be modified so that their wiring structure may be formed using any suitable method known to those of ordinary skill in the art to which the present invention pertains.

What is claimed is:

1. A non-volatile memory device comprising:
   a plurality of first control gate electrodes on a semiconductor substrate;
   a plurality of second control gate electrodes between each adjacent first control gate electrode and recessed into the semiconductor substrate below the bottom of any first control gate electrode;
   a plurality of first storage node films between the semiconductor substrate and the plurality of first control gate electrodes;
   a plurality of second storage node films between the semiconductor substrate and the plurality of second control gate electrodes; and
   a plurality of bit line regions in the semiconductor substrate, each extending across the plurality of first control gate electrodes and the plurality of second control gate electrodes.

2. The non-volatile memory device of claim 1, wherein the plurality of bit line regions have the same waveform as the semiconductor substrate.

3. The non-volatile memory device of claim 1, wherein the plurality of first storage node films and the plurality of second storage node films each include a charge-storing material.

4. The non-volatile memory device of claim 1, wherein the plurality of first storage node films and the plurality of second storage node films each include a silicon nitride layer, a dot of metal or silicon, or a nano-crystal of metal or silicon.

5. The non-volatile memory device of claim 1, wherein the plurality of bit line regions are impurity doped regions in the semiconductor substrate.

6. The non-volatile memory device of claim 5, wherein the plurality of bit line regions are doped with a conductive type of impurities different from that of the semiconductor substrate.

7. The non-volatile memory device of claim 1, further comprising:
   a plurality of first channel regions bounded by a first surface of the semiconductor substrate below the plurality of first gate electrodes; and
   a plurality of second channel regions bounded by a second surface of the semiconductor substrate, the plurality of second control gate electrodes, and two adjacent bit line regions.

8. The non-volatile memory device of claim 7, wherein the plurality of first channel regions and the plurality of second channel regions are spaced apart from each other.

9. The non-volatile memory device of claim 1, further comprising:
   a plurality of first blocking insulation films between the plurality of first storage node films and the plurality of first control gate electrodes; and
   a plurality of second blocking insulation films between the plurality of second storage node films and the plurality of second control gate electrodes.

10. The non-volatile memory device of claim 9, further comprising:
    a plurality of second tunneling insulation films between the plurality of second storage node films and the semiconductor substrate; and
    a plurality of first tunneling insulation films between the plurality of first storage node films and the semiconductor substrate.

11. A method of operating the non-volatile memory device of claim 1, comprising:
    supplying a program voltage to at least one of the plurality of first and second control gate electrodes, and supplying an operation voltage between two adjacent bit line regions.

12. The method of claim 11, wherein supplying the operation voltage includes:
    supplying the operation voltage between the two adjacent bit line regions; and
    supplying a reverse of the operation voltage between the two adjacent bit line regions.

13. The method of claim 11, further comprising:
    forming a unit cell with a first gate electrode, an adjacent second gate electrode, and two adjacent bitlines.

14. The method of claim 13, further comprising:
    programming data into the unit cell.

15. The method of claim 13, further comprising:
programming at least two bits of data into the unit cell.

16. A method of fabricating a non-volatile memory device comprising:
forming a plurality of trenches in a semiconductor substrate;
forming a plurality of bit line regions in the semiconductor substrate that each extend across the plurality of trenches;
forming a plurality of first storage node films on the surface of the semiconductor substrate between the plurality of trenches;
forming a plurality of second storage node films on the semiconductor substrate within the plurality of trenches;
forming a plurality of first control gate electrodes on the plurality of first storage node films; and
forming a plurality of second control gate electrodes on the plurality of second storage node films below the bottom of the plurality of first control gate electrodes.

17. The method claim 16, wherein the bit line regions have the same waveform as the semiconductor substrate.

18. The method of claim 16, wherein the plurality of bit line regions have a waveform along the surface of the semiconductor substrate.

19. The method of claim 16, further comprising:
forming a plurality of first tunneling insulation films on the surface of the semiconductor substrate before forming the plurality of first storage node films.

20. The method of claim 16, further comprising:
forming a plurality of first blocking insulation films on the plurality of first storage node films, wherein the plurality of first control gate electrodes are formed on the plurality of first blocking insulation films.

21. The method of claim 16, further comprising:
forming a plurality of second tunneling insulation films on the semiconductor substrate in the plurality of trenches before forming the plurality of second storage node films.

22. The method of claim 16, further comprising:
forming a plurality of second blocking insulation films on the plurality of second storage node films, wherein the plurality of second gate electrodes are formed on the plurality of second blocking insulation films.

23. The method claim 16, wherein the plurality of first storage node films and the plurality of second storage node films each include a charge-storing material.

24. The method of claim 16, wherein the plurality of first storage node films and the plurality of second storage node films each include a silicon nitride layer, a dot of metal or silicon, or a nano-crystal of metal or silicon.

25. The method of claim 16, wherein the plurality of bit line regions are impurity doped regions in the semiconductor substrate.

26. The method of claim 25, wherein the plurality of bit lines areas are doped with a conductive type of impurities different from that of the semiconductor substrate.

* * * * *